United States Patent [19]
Monk

[11] Patent Number: 6,097,783
[45] Date of Patent: Aug. 1, 2000

[54] DIVIDING CIRCUIT FOR DIVIDING BY EVEN NUMBERS

[75] Inventor: Trevor Monk, Gwent, United Kingdom

[73] Assignee: STMicroelectronics Limited, Bristol, United Kingdom

[21] Appl. No.: 09/221,669

[22] Filed: Dec. 23, 1998

[30] Foreign Application Priority Data

Dec. 23, 1997 [GB] United Kingdom ............... 9727247

[51] Int. Cl.$^7$ ............................................. H03K 21/00
[52] U.S. Cl. ....................... 377/47; 327/156; 327/159; 327/160
[58] Field of Search ................ 377/47; 327/115, 327/117, 156, 159, 160

[56] References Cited

U.S. PATENT DOCUMENTS

| | | | |
|---|---|---|---|
| 3,749,937 | 7/1973 | Rogers | 307/225 C |
| 4,114,049 | 9/1978 | Suzuki | 307/225 C |
| 4,389,728 | 6/1983 | Tsuzuki | 377/114 |
| 4,953,187 | 8/1990 | Herold et al. | 377/48 |
| 5,304,938 | 4/1994 | Gregory | 328/15 |
| 5,425,074 | 6/1995 | Wong | 377/47 |
| 5,854,576 | 12/1998 | Swan | 331/57 |

FOREIGN PATENT DOCUMENTS

| | | | |
|---|---|---|---|
| 62-026920 | 4/1987 | Japan | H03K 5/156 |
| WO 90/05413 | 5/1990 | WIPO | H03K 223/54 |

OTHER PUBLICATIONS

Suzuki et al., "Clocked CMOS Calculator Circuitry," *IEEE Journal of Solid-State Circuits* Dec. 1973, pp. 462–469.

*Primary Examiner*—Margaret R. Wambach
*Attorney, Agent, or Firm*—Theodore E. Galanthay; Robert Iannucci; Seed IP Law Group, PLLC

[57] ABSTRACT

A dividing circuit comprises, connected in a ring, a plurality M of transistor stages, where M is an even integer. Each transistor stage comprises an input node, a clock node and an output node. A tri-state inverter stage has an input node connected to the output node of a preceding transistor stage in the ring, an enable node connected to the clock nodes of the transistor stages, and an output node connected to the input node of a subsequent transistor stage in the ring. Each transistor stage comprises a first pair of transistors of a first conductivity type connected in series between a first voltage level and an output node, and a second pair of transistors of a second conductivity type connected in series between a second voltage level and said output node, wherein control nodes of a first transistor of each said transistor pair are connected together to provide the input node for the stage, and control nodes of a second transistor of each said transistor pair are connected together to provide the clock node for the stage, whereby when an input clock signal is applied to the clock nodes of the transistor stages, an output signal is generated at the output node of the tri-state inverter in which each cycle represents M cycles of the input clock signal.

20 Claims, 7 Drawing Sheets

| IN (I1) | CLK | OUT (O1) |
|---|---|---|
| 0 | 0 | Vdd |
| 0 | 1 | FLOAT |
| 1 | 0 | FLOAT |
| 1 | 1 | GND |

| IN (2) | ENABLE (6) | OUT (4) |
|---|---|---|
| 0 | 0 | FLOAT |
| 1 | 0 | FLOAT |
| 0 | 1 | 1 |
| 1 | 1 | 0 |

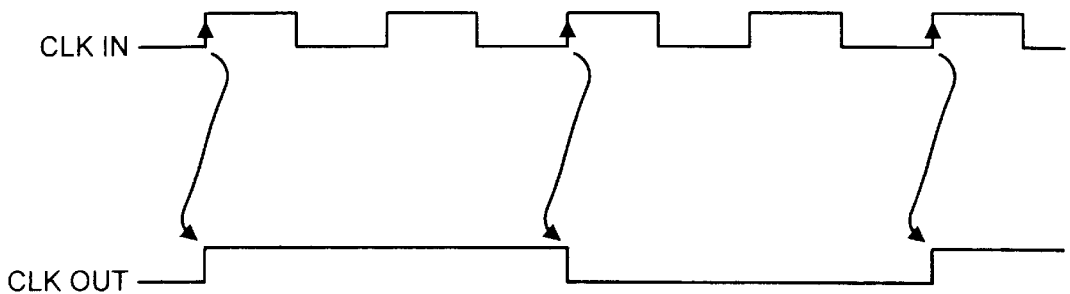
FIG. 4
| CLK IN | V1 | V2 | V3 | V4 | V5 | |
|---|---|---|---|---|---|---|
| 1 | 0 | 1 | 0 | 0 | 1 | INITIAL STATE |
| 0 | 0 | 1 | 0 | 1 | 1 | |
| 1 | 1 | 0 | 0 | 1 | 0 | |
| 0 | 1 | 0 | 1 | 1 | 0 | |
| 1 | 1 | 0 | 1 | 0 | 0 | |
| 0 | 1 | 0 | 1 | 0 | 1 | |
| 1 | 0 | 0 | 1 | 0 | 1 | R |
| 0 | 0 | 1 | 1 | 0 | 1 | |
| 1 | 0 | 1 | 0 | 0 | 1 | |
| 0 | 0 | 1 | 0 | 1 | 1 | |
| 1 | 1 | 0 | 0 | 1 | 0 | |
FIG. 5
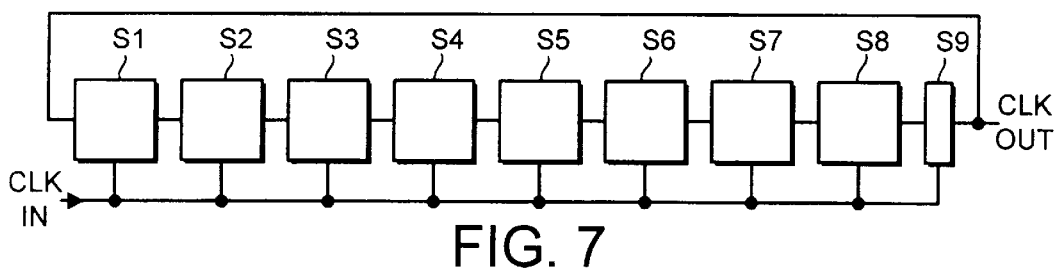
FIG. 7

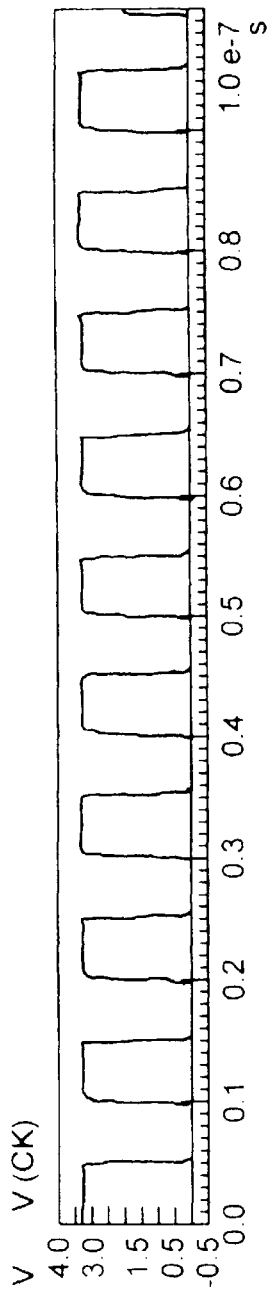
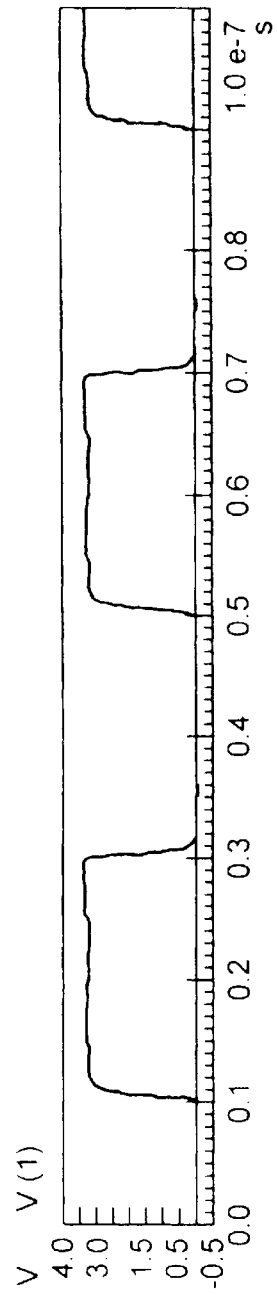
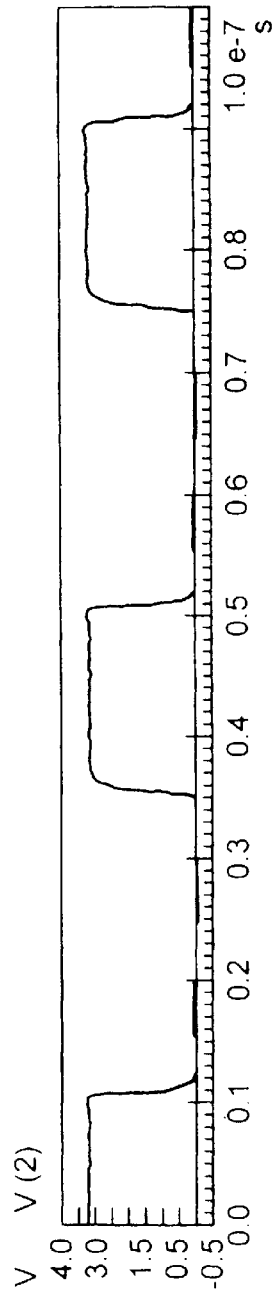
FIG. 6a
FIG. 6b
FIG. 6c

DIVIDING CIRCUIT FOR DIVIDING BY EVEN NUMBERS

TECHNICAL FIELD

This invention relates to a divider circuit for dividing by even numbers.

BACKGROUND OF THE INVENTION

Clock divider circuits are useful in a number of applications, particularly in counters, where a complete cycle of an output signal represents a predetermined number of incoming clock cycles. The cycles of the output signal can be used to "count" the incoming clock cycles.

It is desirable for such clock divider circuits to work at low power and at high frequencies. For example, desired operating parameters might be a current consumption of 10 $\mu$A at a supply voltage of 3.3 V, with an operating frequency of around 100 MHz. It is also desirable that such divider circuits consume a minimum amount of silicon when implemented on an integrated circuit.

Existing counters are generally based on binary counters. Such counters are optimally designed to divide by 2". However, for other even numbers some concatenation of dividing circuits is frequently required to provide the required dividing factor. This increases signal path length and introduces unwanted delays.

SUMMARY OF THE INVENTION

It is an advantage of the present invention to provide a dividing circuit which exhibits an improvement in operating frequency and reducing signal delays with reduced silicon consumption.

According to one aspect of the present invention there is provided a dividing circuit comprising, connected in a ring:

- a plurality M of transistor stages, where M is an even integer, each transistor stage comprising an input node, a clock node and an output node; and
- a tri-state inverter stage having an input node connected to the output node of a preceding transistor stage in the ring, an enable node connected to the clock nodes of the transistor stages, and an output node connected to the input node of a subsequent transistor stage in the ring,
- wherein each transistor stage comprises a first pair of transistors of a first conductivity type connected in series between a first voltage level and the output node; and
- a second pair of transistors of a second conductivity type connected in series between a second voltage level and said output node, wherein control nodes of a first transistor of each said transistor pair are connected together to provide the input node for the stage, and control nodes of a second transistor of each said transistor pair are connected together to provide the clock node for the stage, whereby when an input clock signal is applied to the clock nodes of the transistor stages, an output signal is generated at the output node of the tri-state inverter stage in which each cycle of the output signal represents M cycles of the input clock signal.

Although two "pairs" of transistors are referred to, there is no need for transistors to be matched or otherwise be dependent on one another in their operating parameters.

In the described embodiment, the first transistors are directly connected to the respective first and second voltage levels and the second transistors are directly connected between the first transistors and the output node. This provides a simple transistor configuration which does not consume an excessive amount of silicon in an integrated circuit, yet which provides a high frequency, low power operating transistor stage. In an environment where the first voltage level is a power supply voltage for the stage and the second voltage level is ground, the first pair of transistors are PMOS transistors and the second pair of transistors are NMOS transistors.

The dividing circuit can be rendered programmable by further comprising a switching circuit for selectively connecting one of at least two inputs to an output, wherein the output nodes of at least two alternate transistor stages of the dividing circuit are connected respectively to said at least two inputs, whereby one of said output nodes is selectively connectable to the input node of a subsequent stage so that the integer M is programmable. The switching circuit can have a select input for receiving a select signal to program said integer M by selectively connecting one of said at least two inputs of the switching circuit to the output of the switching circuit.

In the described embodiment, the switching circuit has its output connected to the input node of the tri-state inverter circuit.

The dividing circuit described herein can operate at low powers, for example drawing a current of less than 10 $\mu$A at a supply voltage of 3.3 V and can operate up to high frequencies. It is envisaged that operation up to a frequency of 1 GHz is possible, limited only by the characteristics of a single CMOS transistor. Moreover, the signal at the output of the tri-state inverter has a duty cycle of 50% regardless of the duty cycle of an input signal.

The invention also provides a phase-locked-loop circuit incorporating a dividing circuit as defined herein.

BRIEF DESCRIPTION OF THE DRAWINGS

For a better understanding of the present invention and to show how the same may be carried into effect reference will now be made by way of example to the accompanying drawings.

FIG. 4 shows a representation of the input and output signals for the circuit of FIG. 1.

FIG. 5 shows a sequence of logic states for the circuit of FIG. 1 in operation.

FIGS. 6a to 6f show representations of input and output waveforms for the circuit of FIG. 1.

FIG. 7 shows a circuit diagram of a divide-by-eight circuit.

DETAILED DESCRIPTION OF THE INVENTION

Figures 1, 2, 3:
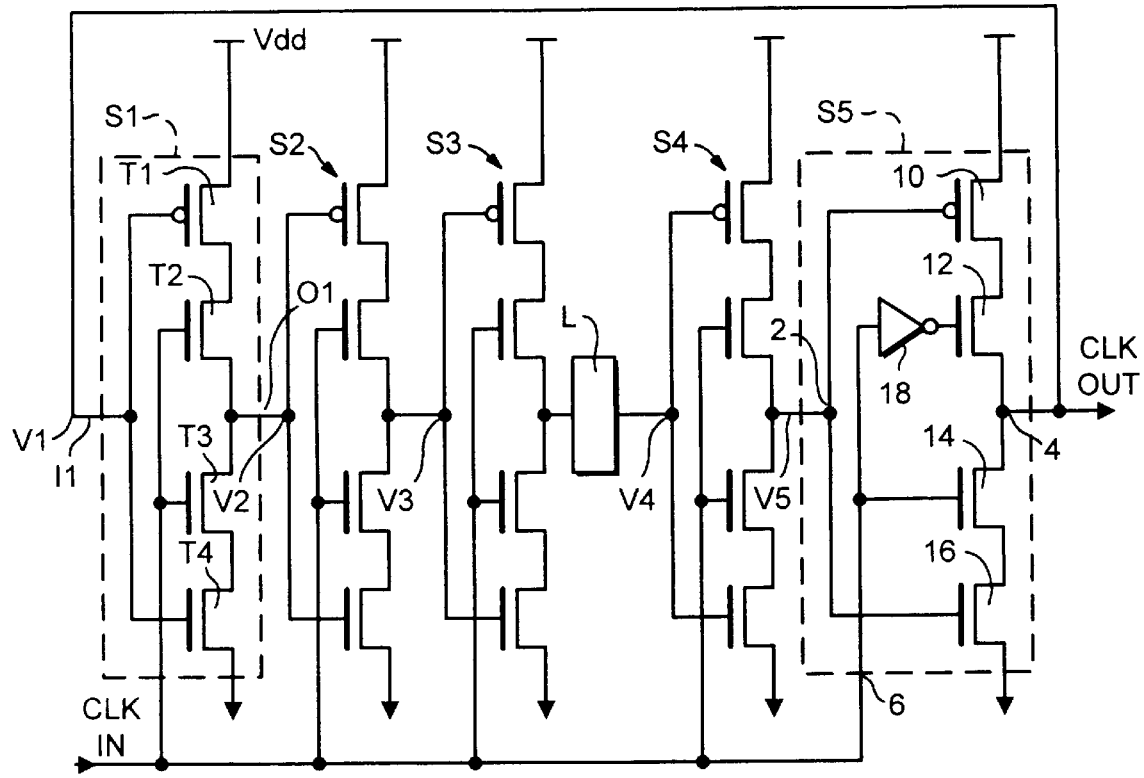
FIG. 1 shows a circuit diagram of a divide-by-four circuit.
FIG. 2 shows a truth table for each transistor stage in the circuit of FIG. 1.
FIG. 3 shows a truth table for a tri-state inverter stage.

FIG. 1 illustrates a divide-by-four (divider) circuit which comprises four stages S1,S2,S3,S4 and a tri-state inverter stage S5 connected in a ring with an input node of each stage connected to an output node of a preceding stage. Each stage comprises a first pair of p-channel MOS transistors T1,T2 and a second pair of n-channel MOS transistors T3,T4. Only the first stage S1 is described in detail herein, the remaining transistor stages (excluding the tri-state inverter stage S5) being the same. The transistors T1,T2 of the first pair are connected in series between a supply voltage Vdd and an output node O1. The transistors T3,T4 of the second pair are connected in series between the output node O1 and ground. The gate of the outermost transistor of each pair T1,T4 is connected to an input node I1 for the stage S1. The gates of the inner two transistors T2,T3 are connected to receive an input clock signal CLK IN.

The stages S2,S3 and S4 represent similar stages, each of which have an outer set of transistors connected to an input node for the stage and an inner set of transistors connected to the input clock signal CLK IN. An output signal is taken from the output node of the tri-state inverter stage S5, the output signal being designated CLK OUT. In the following description, the node of each stage which receives the input clock signal CLK IN and is connected to the gates of the innermost transistors T2,T3 is referred to as the clock node of the stage.

FIG. 2 represents a truth table for each of the stages S1 to S4. Considering the stage S1, when the voltage at the input node I1 has logic state zero, transistor T4 is off and transistor T1 is turned on. In this situation, when the input clock signal CLK IN has a logic state of zero, transistor T2 is likewise turned on, creating a current path which allows the output node O1 to be pulled up to Vdd, as shown in the first line of the truth table of FIG. 2. However, when the input clock signal CLK IN has a logic state of one, the transistor T2 is turned off, with the consequence that the output node O1 "floats" at the logic state it held previously. That is, the output node O1 represents a high impedance state to the subsequent stage and is not driving any output current.

When the voltage at the input node I1 is in logic state one, the transistor T1 is turned off and the transistor T4 is turned on. Now, with the input clock signal CLK IN at logic state zero, the transistor T3 remains off and so the output node O1 floats. When the logic state of the input clock signal CLK IN changes to a one, the transistor T3 is turned on to create a current path allowing the transistors T3 and T4 to pull the output node O1 down to ground.

The tri-state inverter stage S5 has an input node 2 connected to the output node of the preceding stage S4, an output node 4 which is connected to the input node of the transistor stage S1, and an enable input 6 which is connected to the clock nodes of the transistor stages S1 to S4. Tri-state inverters are known in the art and have the truth table shown in FIG. 3, where the state marked "float" has the same meaning as that applied to the transistor stages S1 to S4. One exemplary circuit configuration of a tri-state inverter is illustrated in stage S5 of FIG. 1, but it will be appreciated that other tri-state inverters can be used with the present invention. In the example of FIG. 1, the tri-state inverter stage 5 has a pair of p-channel transistors 10,12 connected between the supply voltage Vdd and the output node 4, and a pair of n-channel transistors 14,16 connected in series between the output node 4 and ground. The gates of the outermost transistors 10,16 are connected together to provide the input node 2 for the tri-state inverter. The gate of the innermost p-channel transistor 12 is connected to the enable input 6 via an inverter 18. The gate of the innermost n-channel transistor 14 is connected directly to the enable input 6. In the circuit of FIG. 1, the enable input 6 receives the input clock signal CLK IN supplied to the divide-by-four circuit, and thus acts as a clock node for the stage S5.

As shown in FIG. 4, the divider circuit represents a divide-by-four counter. That is, one cycle of the output signal CLK OUT represents four cycles of the input clock signal CLK IN. To achieve this, the circuit causes a change in state in the output signal CLK OUT only on every other rising edge of the input clock signal CLK IN. That this is the case can be seen by following through the effect of the truth tables of FIGS. 2 and 3, as in the following description of FIG. 5. Consider an initial state of the circuit illustrated in FIG. 5, where the logic state of the input clock signal CLK IN is high or logic one. The output signal CLK OUT has the same logic state as the input stage I1 for the first stage S1, and is marked V1 in FIG. 5. V2 to V5 represent the output signals of the stages S1 to S4 respectively. In the initial state of FIG. 5, V2 has logic value one, V3 and V4 have logic value zero and V5 has logic value one. When the incoming clock signal CLK IN changes state to logic level zero, the stage S1 has its clock node at zero and its input at zero, so that its output V2 remains at logic level one. The stage S2 still has an input signal (V2) at logic stage one, but because the state of the incoming clock signal CLK IN is now zero, the output node V3 now floats at logic state zero. The stage S3 now has an input state of zero, while the input clock signal CLK IN is zero, thus the state of its output node V4 changes to logic state one. The stage S4 now has a logic state of one at its input while the clock signal is low so that its output V5 floats at the preceding logic state one. The tri-state inverter stage S5 has an input signal at logic state one, while the state of the input clock signal CLK IN is low, so that the output V1 floats at the preceding logic state of logic state zero. This analysis can be followed through for the subsequent changes in state of the incoming input clock signal CLK IN with reference to the truth tables of FIGS. 2 and 3. The result is the tabular data shown in FIG. 5, from which it can be seen that the sequence results in a repeating cycle marked as R, which is represented by the output waveform in FIG. 4.

Initialization is not required to start the divider circuit. It will self-start within a few cycles of the input signal as the result of small asymmetries in the layout. However, initialization circuitry may be added if desired to force a particular initial state. It will readily be appreciated that logic circuitry such as that marked as L in FIG. 1 may be inserted between any two sequential stages of the ring, provided that the logic circuitry L is not inverting.

Power consumption of the divider circuit is very low compared with existing device circuits. One reason for this is that only one internal node changes state on each clock edge, so that the power consumption is dominated by the charge/discharge currents of the capacitance of a single node. Moreover, the maximum operating frequency of the divider circuit can be very high, because the delay introduced by each stage S1 to S5 is only that introduced by a single transistor. In other words, each stage S1 to S5 only comprises one "layer" of transistor logic requiring a change in state between input and output.

The divider circuit of FIG. 1 has the useful property of maintaining a duty cycle of 50% in the output signal whether or not the input signal has a duty cycle of 50%.

Figure 6D:
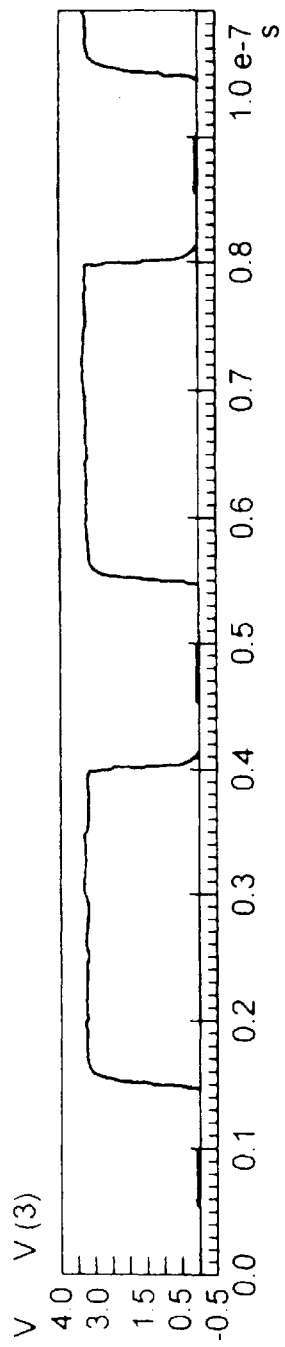
Figure 6E:
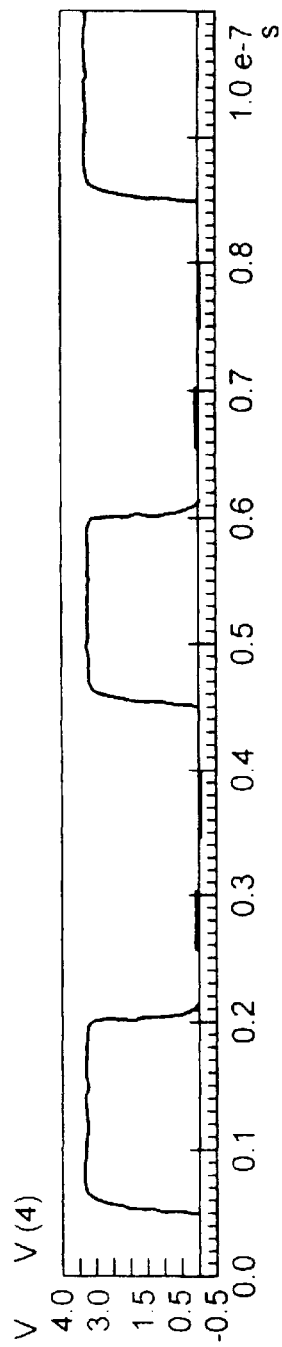
Figure 6F:
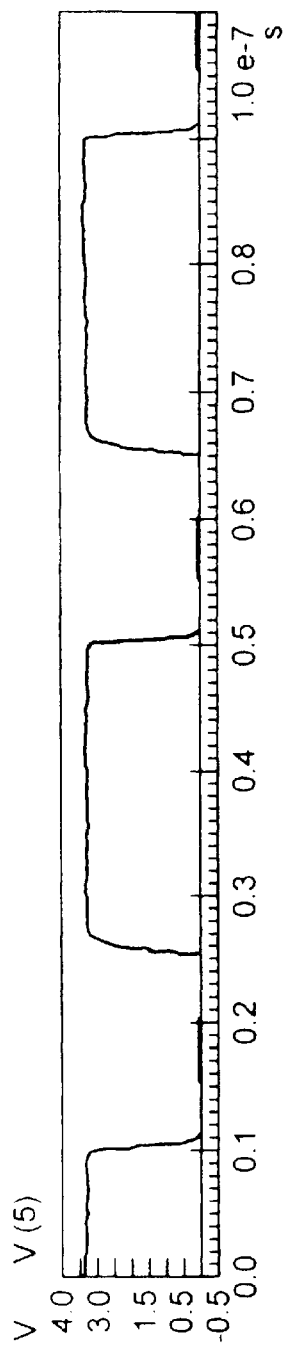

FIG. 6a represents an input waveform of the input clock signal CLK IN having a duty cycle of 50%. FIG. 6b shows the output signal (marked as V(1) in FIG. 6b) at the output node 4 of the tri-state inverter of stage S5. The output signal is a divide-by-four version of the input clock signal CLK IN and has a duty cycle of 50%. The outputs of the other transistor stages S1 to S4, labeled V(2) to V(5), are shown in FIGS. 6c to 6f These outputs still represent a divide-by-four version of the input clock signal CLK IN, but do not have a 50% duty cycle. Thus, for applications where a 50% duty cycle is important, the output signal from the divide-by-four circuit should be taken from the output of the tri-state inverter of stage S5. However, for applications where it is not necessary to supply a signal with a 50% duty cycle, the output may be taken from any of the transistor stages S1 to S4.

The principle of operation of the divide-by-four circuit shown in FIG. 1 can readily be extended to other even numbers to provide a divide-by-M circuit, where M is an even integer. FIG. 7 is a circuit diagram of a divide-by-eight circuit, which has eight transistor stages S1 to S8, each of which is of the type labeled S1 to S4 in FIG. 1, and a tri-state inverter stage labeled S9 similar to the stage S5 of FIG. 1.

Figure 8A:
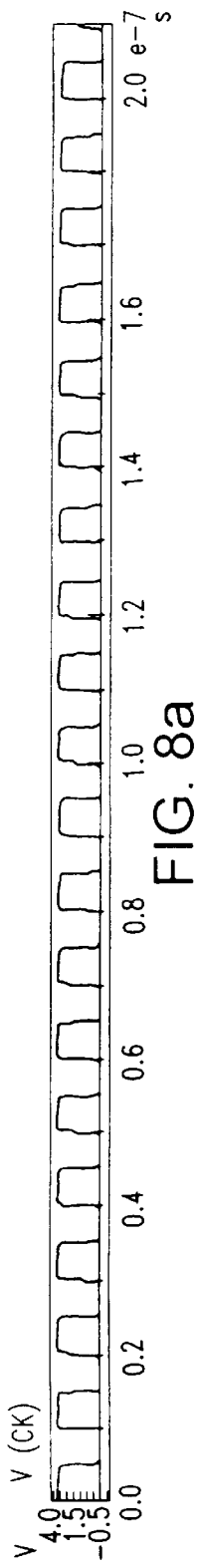
FIGS. 8a to 8j show representations of waveforms for the circuit of FIG. 7.
Figure 8B:
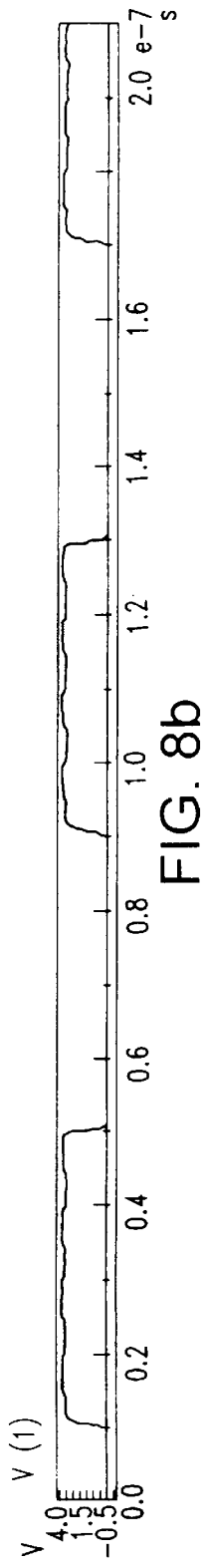
Figure 8C:
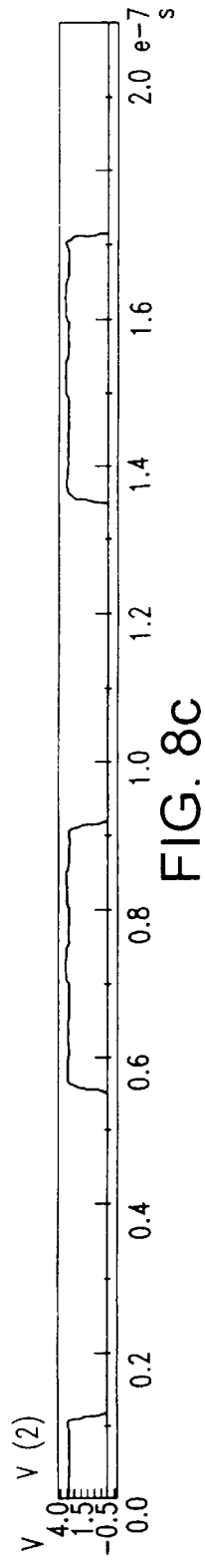
Figure 8D:
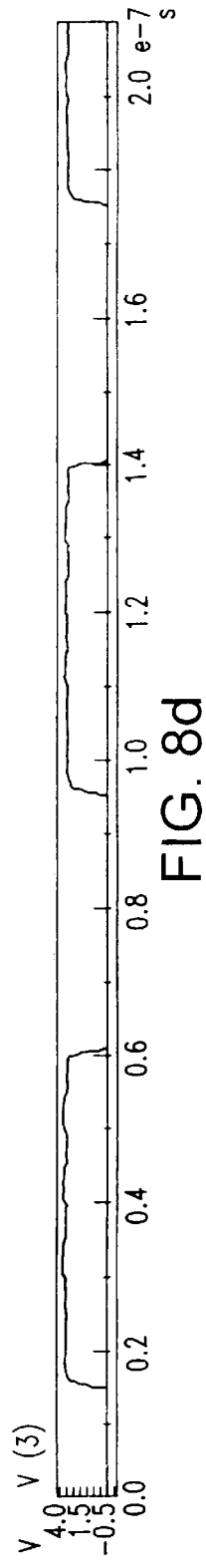
Figure 8E:
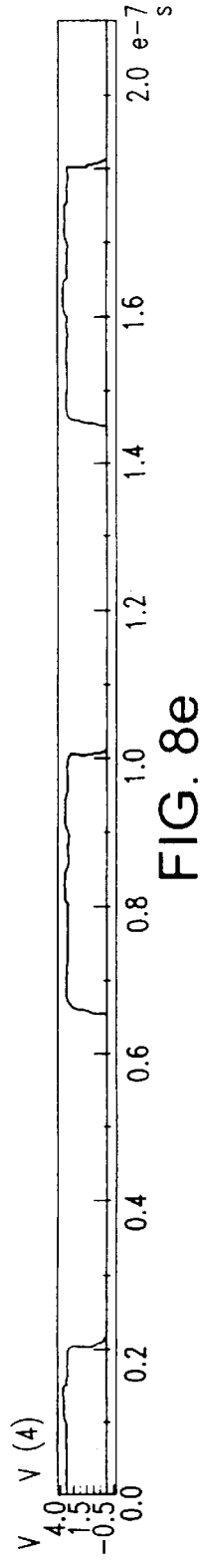
Figure 8F:
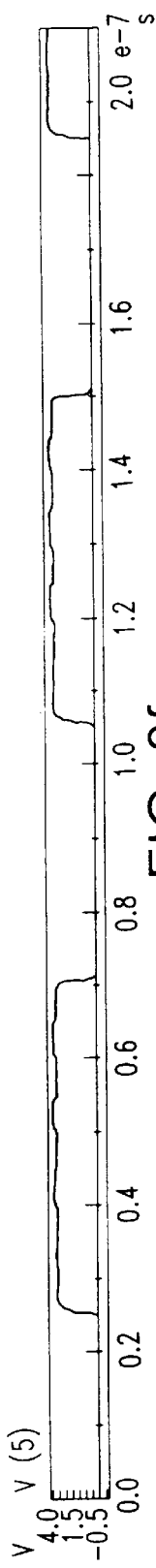
Figure 8G:
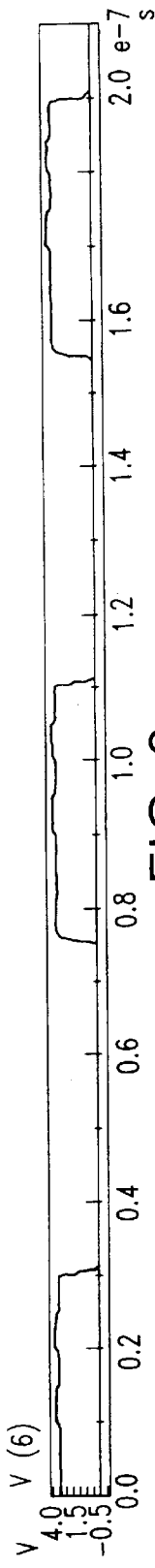
Figure 8H:
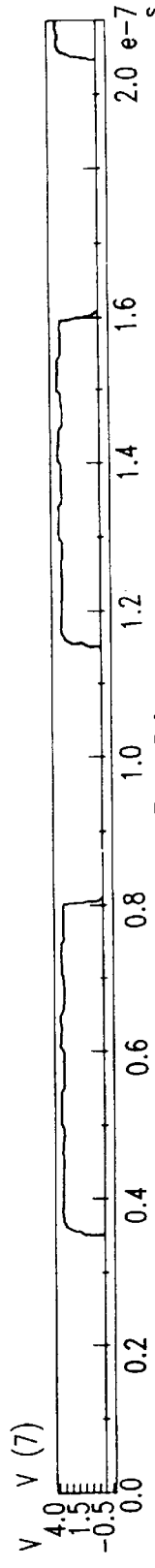
Figure 8I:
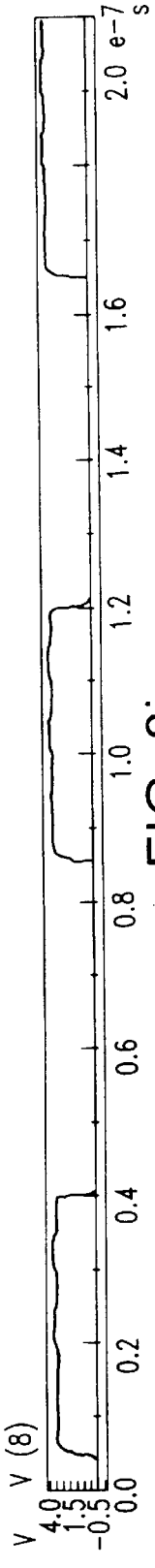
Figure 8J:
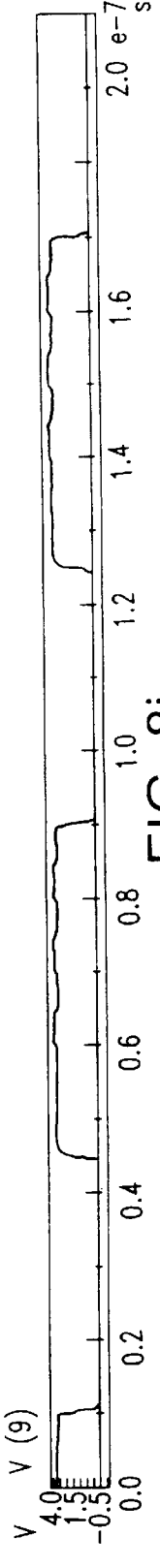

FIGS. 8a to 8j represent waveforms for the divide-by-eight circuit of FIG. 7. FIG. 8a shows an input signal having a 50% duty cycle applied to the divide-by-eight circuit of FIG. 7. FIG. 8b illustrates the output waveform for the output signal CLK OUT at the output node of the tri-state inverter stage S9. As can be seen, this has a duty cycle of 50%. FIGS. 8c to 8j are the output signals from the other output nodes of the stages S1 to S8 in the ring, labeled V2 to V9, respectively. The output signals at these output nodes each represent a divide-by-four version of the input signal, but not at a duty cycle of 50%.

Figure 9:
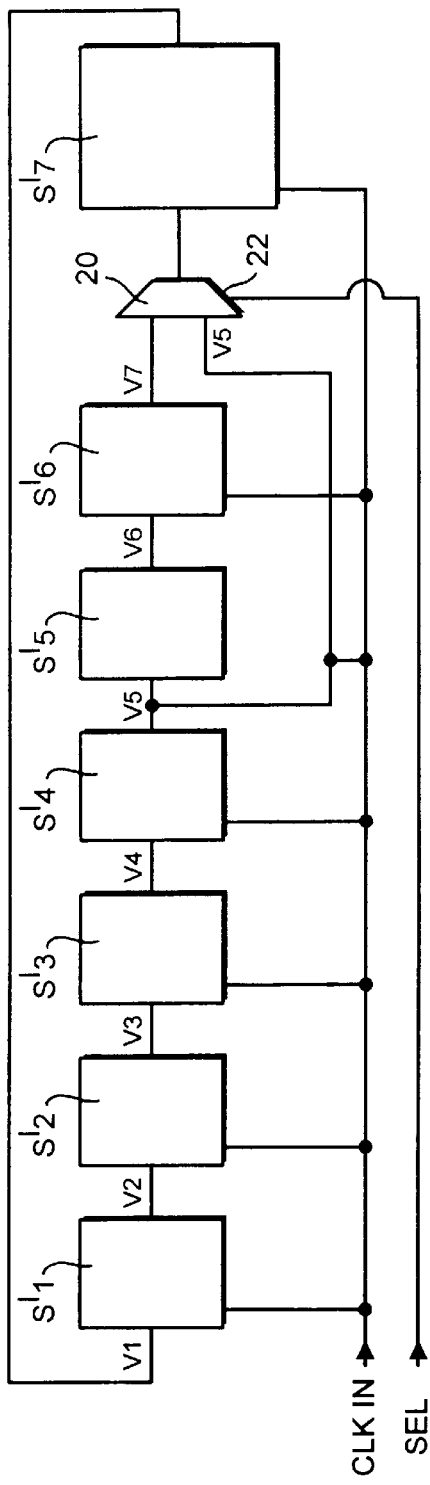
FIG. 9 shows a diagram of a programmable divide-by-four/divide-by-six circuit.

FIG. 9 illustrates how a programmable divider circuit may be constructed to divide by a selected even integer M. FIG. 9 illustrates a programmable divider circuit which can selectively divide by four or six. The divider circuit comprises six transistor stages S'1 to S'6 and a tri-state inverter stage S'7 connected in a ring. The transistor configuration of each of the stages S'1 to S'6 is not shown in FIG. 9 but is the same as each of the stages S1 to S4 in FIG. 1. The tri-state inverter stage S'7 can take the form illustrated as stage S5 in FIG. 1 or any suitable alternative tri-state inverter circuit known in the art. A multiplexer 20 has one input connected to the output V7 of the transistor stage S'6 and another input connected to the output V5 of the fourth stage S'4. The output of the multiplexer 20 forms an input to the tri-state inverter stage S'7. The multiplexer 20 has a select input 22 which receives a select signal SEL which controls whether the output of the sixth transistor stage S'6 or the fourth transistor stage S'4 is supplied as the input to the tri-state inverter stage S'7. It will be appreciated that any suitable multiplexer could be used to selectively supply the output of the fourth stage S'4 or sixth stage S'6 as the input of the tri-state inverter stage S'7. It can thus be understood that the divider circuit can be programmed to divide by four or six depending on the state of the select signal SEL. When the select signal SEL is low, the output of the fourth stage S'4 is supplied as the input to the tri-state inverter stage S'7, so that the ring operates as a divide-by-four circuit as described above with reference to FIG. 1. If the select signal SEL goes high, the output of the sixth stage S'6 is supplied as the input to the tri-state inverter stage S'7, so that the ring operates as a divide-by-six divider circuit. It is possible to change the dividing integer M "on the fly" by appropriately selecting the time at which the state of the select signal SEL is changed relative to the input clock signal CLK IN.

It will readily be appreciated that the principle illustrated above with respect to a programmable divide-by-four/divide-by-six circuit can be applied to any selected even number M by appropriately selecting the transistor stages whose outputs are supplied to the multiplexer. Moreover, it is possible to construct a programmable divider circuit which can selectively divide by three or more even integers by having a multiplexer 20 with three or more inputs to which the outputs of the appropriate transistor stages are supplied.

Figure 10:
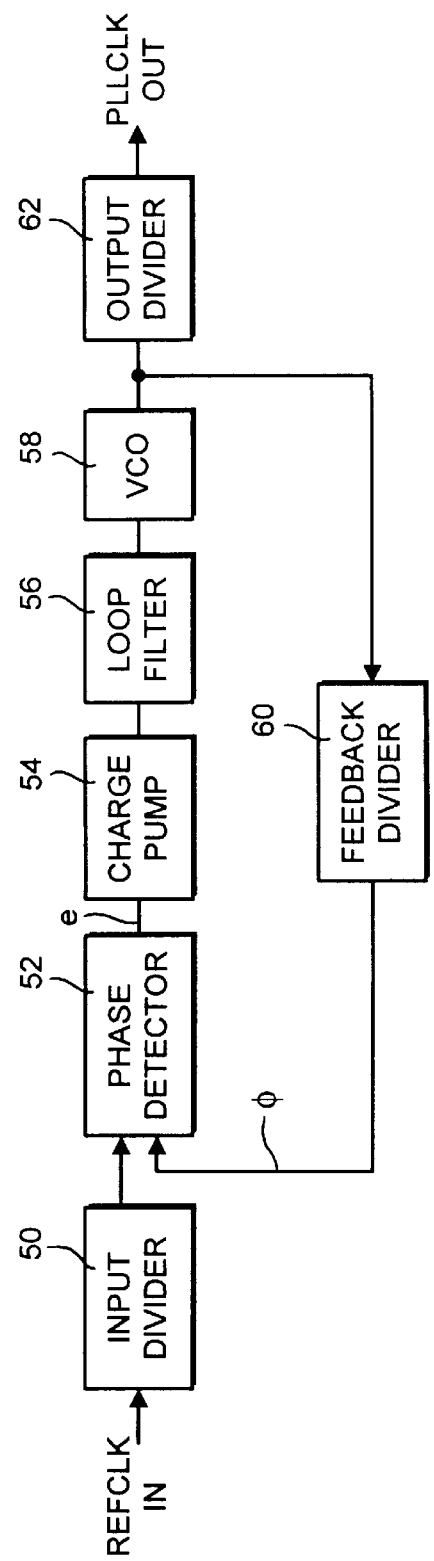
FIG. 10 shows a block diagram of a phase-locked-loop circuit.

FIG. 10 is a diagram of a basic phase-locked-loop circuit in which the dividing circuits described herein are particularly useful. The phase-locked-loop receives a reference clock input REF CLK IN and generates a PLL clock output PLL CLK OUT. An input divider 50 creates from the reference clock input REF CLK IN a reference input frequency for a phase detector 52. The phase detector 52 also receives as an input a feedback signal φ generated in a manner described in the following. If the two inputs to the phase detector 52 differ in phase, an error output e is generated and is supplied to a charge pump 54. A loop filter 56 shapes the output of the charge pump 54 and generates a correction signal for a voltage controlled oscillator 58. The output of the voltage controlled oscillator 58 is passed through a feedback divider 60 to generate the second input (feedback signal φ) to the phase detector 52. The output of the voltage controlled oscillator 58 is also passed through an output divider 62 to generate the clock output PLL CLK OUT.

A dividing circuit in accordance with the present invention can usefully be used to implement any of the input divider 50, feedback divider 60, or output divider 62 to provide a phase-locked-loop satisfying required technology, frequency and power constraints.

From the foregoing it will be appreciated that, although specific embodiments of the invention have been described herein for purposes of illustration, various modifications may be made without deviating from the spirit and scope of the invention. Accordingly, the invention is not limited except as by the appended claims, the scope of which are to be made in accordance with established doctrines of claim interpretation.

What is claimed is:

1. A dividing circuit comprising, connected in a ring:
   a plurality M of transistor stages, wherein M is an even integer, each transistor stage comprising an input node, a clock node and an output node; and
   a tri-state inverter stage having an input node connected to the output node of a preceding transistor stage in the ring, an enable node connected to the clock nodes of the transistor stages, and an output node connected to an input node of a subsequent transistor stage in the ring,
   wherein each transistor stage comprises a first pair of transistors of a first conductivity type connected in series between a first voltage level and an output node; and
   a second pair of transistors of a second conductivity type connected in series between a second voltage level and said output node, wherein control nodes of a first transistor of each said transistor pair are connected together to provide the input node for the stage, and control nodes of a second transistor of each said transistor pair are connected together to provide the clock node for the stage, whereby when an input clock signal is applied to the clock nodes of the transistor stages, an output signal is generated at the output node of the tri-state inverter stage in which each cycle of the output signal represents M cycles of the input clock signal.

2. The dividing circuit according to claim 1 wherein M is ten or less.

3. The dividing circuit according to claim 1, further comprising a non-inverting logic circuit connected in the ring between any two sequential stages.

4. The dividing circuit according to claim 1 wherein the first transistors of each said transistor stage are directly connected to the respective first and second voltage levels, and wherein the second transistors of each said transistor stage are directly connected between the first transistors and the output node of the stage.

5. The dividing circuit according to claim 1 wherein the first voltage level is a power supply voltage for the dividing circuit and the second voltage level is ground.

6. The dividing circuit according to claim 5 wherein the first pair of transistors are PMOS transistors and the second pair of transistors are NMOS transistors.

7. The dividing circuit according to claim 1, further comprising a switching circuit to selectively connect one of at least two inputs to an output, wherein the output nodes of at least two alternate transistor stages of the dividing circuit are connected respectively to said at least two inputs, whereby one of said output nodes is selectively connectable to the input node of a subsequent stage so that the integer M is programmable.

8. The dividing circuit according to claim 7 wherein the switching circuit has a select input to receive a select signal to program said integer M by selectively connecting one of said at least two inputs of the switching circuit to the output of the switching circuit.

9. A dividing circuit according to claim 7 wherein the switching circuit has its output connected to the input node of the tri-state inverter stage.

10. A phase-locked-loop circuit, comprising:
   a phase detector having a first input to receive a reference signal and a second input to receive a feedback signal, the phase detector operable to generate an error signal according to a relative phase of the reference signal and the feedback signal;
   a voltage controlled oscillator connected to receive a signal representative of the error signal generated by the phase detector; and
   a dividing circuit connected to receive an output from the voltage controlled oscillator and to divide the output by a predetermined integer to generate the feedback signal, the dividing circuit comprising, connected in a ring:
      a plurality M of transistor stages, wherein M is an even integer, each transistor stage comprising an input node, a clock node and an output node; and
      a tri-state inverter stage having an input node connected to the output node of a preceding transistor stage in the ring, an enable node connected to the clock nodes of the transistor stages, and an output node connected to the input node of a subsequent transistor stage in the ring,
      wherein each transistor stage comprises a first pair of transistors of a first conductivity type connected in series between a first voltage level and an output node; and
      a second pair of transistors of a second conductivity type connected in series between a second voltage level and said output node, wherein control nodes of a first transistor of each said transistor pair are connected together to provide the input node for the stage, and control nodes of a second transistor of each said transistor pair are connected together to provide the clock node for the stage, whereby when an input clock signal is applied to the clock nodes of the transistor stages, an output signal is generated at the output node of the tri-state inverter stage in which each cycle of the output signal represents M cycles of the input clock signal.

11. A phase-locked-loop circuit, comprising:
   a phase detector having a first input to receive a reference signal and a second input to receive a feedback signal, the phase detector operable to generate an error signal according to a relative phase of the reference signal and the feedback signal;
   a voltage controlled oscillator connected to receive a signal representative of the error signal generated by the phase detector;
   a dividing circuit connected to receive an output from the voltage controlled oscillator and to divide the output by a predetermined integer to generate the feedback signal; and
   an output divider connected to receive the output from the voltage controlled oscillator to generate a divided output signal, the output divider comprising, connected in a ring:
      a plurality M of transistor stages, wherein M is an even integer, each transistor stage comprising an input node, a clock node and an output node; and
      a tri-state inverter stage having an input node connected to the output node of a preceding transistor stage in the ring, an enable node connected to the clock nodes of the transistor stages, and an output node connected to the input node of a subsequent transistor stage in the ring,
      wherein each transistor stage comprises a first pair of transistors of a first conductivity type connected in series between a first voltage level and an output node; and
      a second pair of transistors of a second conductivity type connected in series between a second voltage level and said output node, wherein control nodes of a first transistor of each said transistor pair are connected together to provide the input node for the stage, and control nodes of a second transistor of each said transistor pair are connected together to provide the clock node for the stage, whereby when an input clock signal is applied to the clock nodes of the transistor stages, an output signal is generated at the output node of the tri-state inverter stage in which each cycle of the output signal represents M cycles of the input clock signal.

12. A phase-locked-loop circuit, comprising:
   a phase detector having a first input to receive a reference signal and a second input to receive a feedback signal, the phase detector operable to generate an error signal according to a relative phase of the reference signal and the feedback signal;
   a voltage controlled oscillator connected to receive a signal representative of the error signal generated by the phase detector; and
   a dividing circuit connected to receive an output from the voltage controlled oscillator and to divide the output by a predetermined integer to generate the feedback signal; and
   an input divider for dividing the reference signal prior to the phase detector, the input divider comprising, connected in a ring:
      a plurality M of transistor stages, wherein M is an even integer, each transistor stage comprising an input node, a clock node and an output node; and a tri-state inverter stage having an input node connected to the output node of a preceding transistor stage in the ring, an enable node connected to the clock nodes of the transistor stages, and an output node connected to the input node of a subsequent transistor stage in the ring, wherein each transistor stage comprises a first pair of transistors of a first conductivity type connected in series between a first voltage level and an output node; and a second pair of transistors of a second conductivity type connected in series between a second voltage level and said output node, wherein control nodes of a first transistor of each said transistor pair are connected together to provide the input node for the stage, and control nodes of a second transistor of each said transistor pair are connected together to provide the clock node for the stage, whereby when an input clock signal is applied to the clock nodes of the transistor stages, an output signal is generated at the output node of the tri-state inverter stage in which each cycle of the output signal represents M cycles of the input clock signal.

13. A dividing circuit, comprising:

a plurality M of even integers of transistor stages connected in a ring, each transistor stage having a first pair of transistors of a first conductivity type connected in series between a first voltage level and an output node, and a second pair of transistors of a second conductivity type connected in series between a second voltage level and the output node, wherein control nodes of a first transistor of each transistor pair are connected together to provide an input node for the transistor stage and control nodes of a second transistor of each transistor pair are connected together to provide a clock node for the transistor stage; and a tri-state inverter stage having an input node connected to the output node of a selected transistor stage in the ring, an enable node connected to the clock nodes of the transistor stages, and an output node connected to the input node of a transistor stage in the ring different from the selected transistor stage, the output node of the tri-state inverter generating an output signal having a cycle substantially equal to M cycles of a clock signal applied to the clock nodes of the transistor stages and to the enable node.

14. The dividing circuit of claim 13 wherein a duty cycle of the output signal of the tri-state inverter has a duty cycle closer to 50% than a duty cycle of the clock signal.

15. The dividing circuit of claim 13, further comprising a non-inverting logic circuit connected in the ring between any two sequential stages.

16. The dividing circuit of claim 13 wherein the first voltage level is a power supply voltage for the dividing circuit and the second voltage level is ground, such that application of a logic zero voltage to the input node of one transistor stage drives the output signal at the output node of the one transistor stage towards the power supply voltage if the clock signal is at logic zero voltage, the output signal at the output node of the one transistor stage floating substantially at an existing voltage level if the clock signal is at logic one voltage.

17. The dividing circuit of claim 13 wherein the first voltage level is a power supply voltage for the dividing circuit and the second voltage level is ground, such that application of a logic one voltage to the input node of one stage drives the output signal at the output node of the one stage towards ground if the clock signal is at logic one voltage, the output signal at the output node of the one stage floating substantially at an existing voltage level if the clock signal is at logic zero voltage.

18. The dividing circuit of claim 13, further comprising a switching circuit to selectively connect one of two inputs to an output, the output nodes of two alternate transistor stages of the dividing circuit connected respectively to the two inputs, the switching circuit connecting the one of the two inputs to the output to change the integer M of transistor stages in the dividing circuit in response to a selecting signal applied to the switching circuit.

19. A phase-locked-loop circuit, comprising:

a phase detector having a first input to receive a reference signal and a second input to receive a feedback signal, the phase detector operable to generate an error signal according to a relative phase of the reference signal and the feedback signal;

a voltage controlled oscillator connected to receive a signal representative of the error signal generated by the phase detector; and a feedback divider circuit connected to receive an output from the voltage controlled oscillator and to divide the output by a predetermined integer to generate the feedback signal; and an input divider for dividing the reference signal prior to the phase detector, the input divider comprising:

a plurality M of even integers of transistor stages connected in a ring, each transistor stage having a first pair of transistors of a first conductivity type connected in series between a first voltage level and an output node, and a second pair of transistors of a second conductivity type connected in series between a second voltage level and the output node, wherein control nodes of a first transistor of each transistor pair are connected together to provide an input node for the transistor stage and control nodes of a second transistor of each transistor pair are connected together to provide a clock node for the transistor stage; and a tri-state inverter stage having an input node connected to the output node of a selected transistor stage in the ring, an enable node connected to the clock nodes of the transistor stages, and an output node connected to the input node of a transistor stage in the ring different from the selected transistor stage, the output node of the tri-state inverter generating the divided reference signal having a cycle substantially equal to M cycles of a clock signal applied to the clock nodes of the transistor stages and to the enable node.

20. The phase-locked-loop circuit of claim 19, further comprising an output divider connected to receive the output from the voltage controlled oscillator and to divide the output by a predetermined integer to generate a divided output signal.

* * * * *